United States Patent [19]
Dent

[11] Patent Number: 5,834,987
[45] Date of Patent: Nov. 10, 1998

[54] FREQUENCY SYNTHESIZER SYSTEMS AND METHODS FOR THREE-POINT MODULATION WITH A DC RESPONSE

[75] Inventor: Paul Wilkinson Dent, Pittsboro, N.C.

[73] Assignee: Ercisson Inc., Research Triangle Park, N.C.

[21] Appl. No.: 902,836

[22] Filed: Jul. 30, 1997

[51] Int. Cl.[6] ............... H03C 3/00; H03C 1/00; H03K 7/02; H03L 7/18

[52] U.S. Cl. ............ 332/127; 332/128; 331/16; 331/17; 331/23; 327/105; 327/156; 455/260; 341/143

[58] Field of Search .................... 332/127, 128; 331/14, 16, 17, 23, 25; 327/105–107, 156–159; 455/260; 341/143

[56] References Cited

U.S. PATENT DOCUMENTS

| | | | |
|---|---|---|---|
| 4,179,670 | 12/1979 | Kingsbury | 331/10 |
| 5,095,288 | 3/1992 | Dent | 331/17 |
| 5,111,162 | 5/1992 | Hietala et al. | 332/127 |
| 5,150,082 | 9/1992 | Grimmett et al. | 331/23 X |
| 5,180,993 | 1/1993 | Dent | 331/16 |
| 5,311,152 | 5/1994 | Lautzenhizer | 332/127 |
| 5,424,688 | 6/1995 | Phillips | 331/16 |

*Primary Examiner*—David Mis
*Attorney, Agent, or Firm*—Myers Bigel Sibley & Sajovec

[57] ABSTRACT

A frequency synthesizer includes a controlled oscillator which is responsive to a frequency control input signal, to generate an output frequency. A programmable frequency divider is responsive to the output frequency and to a divider control input, to divide the output frequency by a first integral ratio or by a second integral ratio in response to the divider control input, to thereby produce a divided signal. A phase comparator is responsive to a reference frequency signal and to the divided signal, to compare the reference frequency signal and the divided signal, and thereby produce a first error signal. A sigma-delta modulator is responsive to a modulation input to produce the divider control input. A loop filter is responsive to the first error signal, to thereby produce the frequency control input signal. Ripple compensation signals and direct modulation signals may also be provided, to provide a three-point modulator for a frequency synthesizer. Analog and digital embodiments may also be provided.

29 Claims, 7 Drawing Sheets

FREQUENCY SYNTHESIZER SYSTEMS AND METHODS FOR THREE-POINT MODULATION WITH A DC RESPONSE

FIELD OF THE INVENTION

The present invention relates to radio communications, and more particularly to frequency synthesizers for generating radio signals.

BACKGROUND OF THE INVENTION

Figure 1:
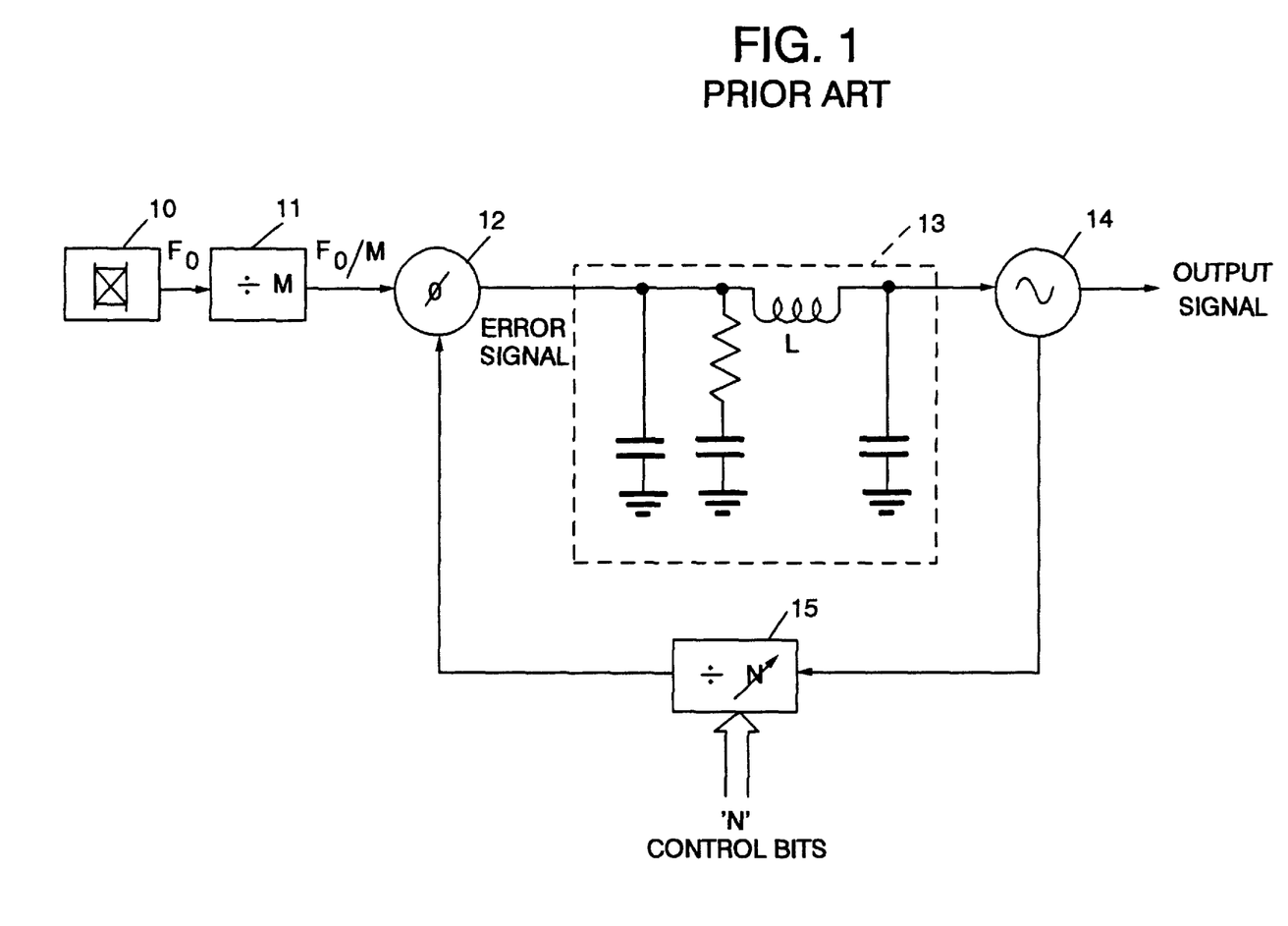
FIG. 1 is a block diagram of a conventional frequency synthesizer.

Frequency synthesizer systems and methods are widely used in radio communications to produce accurate discrete frequency steps. FIG. 1 illustrates a conventional digital frequency synthesizer. A stable reference frequency source such as a crystal oscillator 10 produces an accurate signal frequency Fo that may be divided down by any integral ratio 'M' to a lower reference frequency Fo/M using reference divider 11. A voltage controlled oscillator (VCO) generates a desired output signal. The output signal is desired to be controlled to a given integer multiple 'N' times the divided down reference frequency Fo/M, thus generating a desired frequency N·Fo/M. The VCO signal frequency is thus divided down by a programmable factor 'N' in a programmable or variable divider 15, which should produce the frequency Fo/M if the VCO frequency is N·Fo/M as desired.

Phase and frequency comparator or detector 12 compares the divided down VCO frequency from variable divider 15 with the divided down reference frequency from reference divider 11 in order to produce an error signal if the frequency or phase is not the same. The error signal is filtered in loop filter 13 to remove ripple at the comparison frequency Fo/M and is applied to the control input of VCO 14 in order to correct its frequency and phase until the signal frequency is exactly N·Fo/M. Thus, by programming variable divider 15 to divide by different N-values, for example using N control bits, the generated frequency can be controlled to any integer multiple of Fo/M, i.e. in discrete steps of Fo/M.

If it is desired to generate a signal frequency that is controlled in very small steps such as 1 Hz, the conventional synthesizer of FIG. 1 divides the reference frequency Fo down to 1 Hz using a large value of M. The phase comparator then compares frequencies of 1 Hz, and the loop filter operates to filter out 1 Hz ripple, which generally produces very long filtering time constants. Consequently, a conventional synthesizer that produces small frequency step sizes generally is also very slow to change frequency. Typically, the time to switch frequency is a minimum of 80 cycles of the divided down reference frequency Fo/M, for example, 80 seconds in the 1 Hz step size example.

Figure 2:
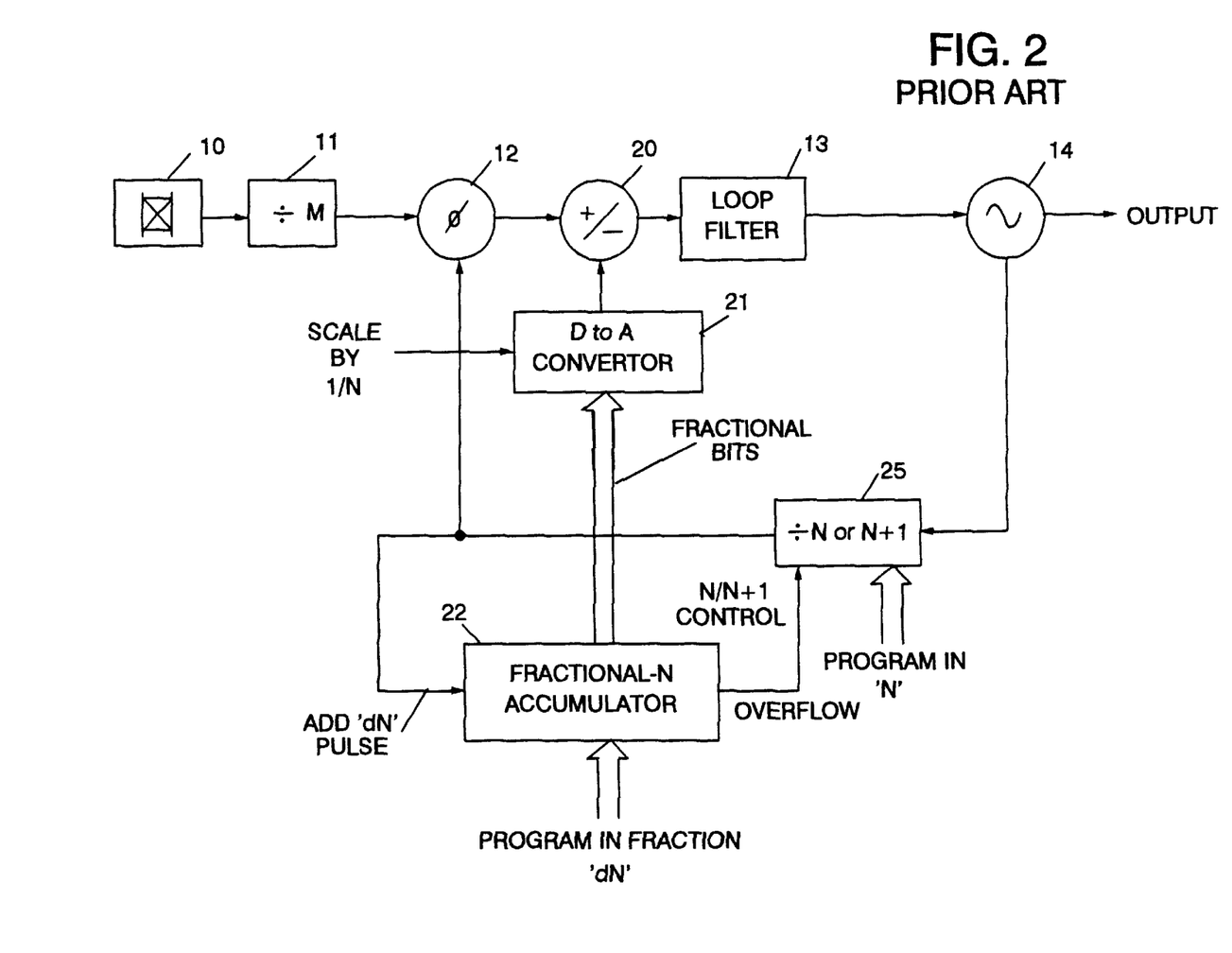
FIG. 2 is a block diagram of a conventional fractional-N frequency synthesizer.

A fractional-N synthesizer, such as illustrated in FIG. 2, may alleviate the problem of long frequency changing time by obtaining frequency step sizes that can be a fraction of the phase comparison frequency. Fractional-N synthesizers generate a signal frequency between two discrete frequencies by alternating between the two discrete frequencies in a given pattern.

Referring now to FIG. 2, a reference source (oscillator) 10 and reference divider 11 produce a divided down reference frequency Fo/M to phase detector 12. A variable or programmable divider 25 divides down the frequency of VCO 14 by a programmable integer N, but with the added facility that the value of N used may be changed from N to N+1, for example, by a signal on an N/N+1 control input. When "divide by N+1" is selected, the next output pulse will occur one VCO cycle later than it would have otherwise. Thus when the desired VCO frequency to be produced is slightly higher than N times Fo/M, the output pulse from divider 25 becomes progressively earlier, causing an increasing phase error at the output of phase detector 12. When this cumulative phase error becomes equal to approximately one cycle of the VCO, it can be reset to zero by retarding the next output pulse from divider 25 by causing it to divide by N+1 for one divide cycle.

The pattern of dividing by N a number of times and then dividing by N+1 to reset the cumulative phase error is then repeated. Since the average phase error is thereby held to zero, the average VCO frequency lies between N·Fo/M and (N+1)·Fo/M according to the duty factor of divide-by-N's to divide-by-(N+1)'s. The instantaneous phase error however comprises a sawtooth-like waveform that rises linearly during periods of divide-by-N until abruptly reset by a divide-by-(N+1).

It is also possible to use divide by N and divide by N−1 to produce frequencies between N and N-I times Fo/M, which is equivalent to dividing by N+1 as the dominant division ratio interspersed with single divisions by N to reset cumulative phase error. Patterns of division such as

N,N,N,(N+1),N,N,N,(N+1)

or (N+1),(N+1),(N+1),N,(N+1),(N+1),(N+1),N, or

N,N,N,(N−1),N,N,(N−1),N,N, or (N−1),(N−1),(N−1),N,(N−1),(N−1),(N−1),N, are also possible.

The sawtooth-like phase error waveform will generally produce unwanted sawtooth frequency modulation of the VCO unless compensated or filtered out using long time constants in loop filter 13. Since it is desirable to avoid long time constants, the fractional-N synthesizer generally uses ripple compensation instead.

The pattern of divisions by N and N+1 may be generated by applying an increment to a fractional-N accumulator 22, modulo the denominator of the fractional frequency it is desired to generate. For example, if it is desired to generate frequencies such as (N+0.1)Fo/M,(N+0.2)Fo/M,(N+0.3)Fo/M then accumulator 22 increments modulo-10. If an increment of 1 is applied to the accumulator input, assuming it starts at zero, it will increment through the repeating sequence with overflow or 'carry' outputs upon rolling over modulo-10 from 9 back to zero. The carry pulses occur every ten increments, and are used to select the N+1 division ratio of divider 25. The division cycle thus produced comprises 9 divide-by-N's and one divide by N+1, producing a mean division ratio of N+0.1. Likewise, if the increment to the accumulator is 2, it will produce the sequence 0,2,4,6,8,0,2,4,6,8,0,2 . . .

having a one carry output every five increments. An increment of 3 produces the sequence 0,3,6,9,2,5,8,1,4,7,0, . . .

which produces a pattern of 3 carries every ten increments, and so forth. Thus the choice of increment provides a proportion of divide by N+1's exactly equal to the desired decimal fraction.

Moreover, the number in the accumulator at any time is related to the cumulative phase error out of phase detector 12 before it is reset (with each carry pulse causing a divide by N+1 cycle). The desired ripple compensation waveform may thus be obtained by digital-to-analog (DtoA) converting the accumulator contents using DtoA convertor 21. The compensation waveform is then scaled to the correct level and subtracted from the phase detector error signal in subtractor 20.

It can be shown that the proper scaling includes a factor 1/N to make the compensation accurate for all values of the integral part of the division ratio N. U.S. Pat. No. 4,179,670 to Kingsbury discloses that a scaling proportional to 1/N can be obtained by multiplication with the output pulse from variable divider 25, which occurs every N VCO cycles and thus has a mark/space ratio proportional to 1/N. The Kingsbury '670 patent is hereby incorporated by reference herein. U.S. Pat. No. 5,180,993 to the present inventor, which is also hereby incorporated by reference herein, describes an alternative method. Instead of scaling the compensation signal down by a factor 1/N, the phase error signal from phase detector 12 is scaled up by a factor proportional to N by using a phase detector known as a charge pump having a programmable output current level. The latter has the additional advantage that loop-bandwidth changes caused by varying N are also compensated. Either method can also be used in the present invention.

It is also known that frequency modulation can be applied to a frequency synthesizer digitally by feeding numerical samples of the modulation waveform into the frequency control input of the synthesizer. The control input comprises an input N to variable divider 25 for the whole part of the frequency and an increment input dN to accumulator 22 for the fractional part of the frequency. The sampling rate for representing the modulation waveform is thus equal to the counting cycle rate at the output of variable divider 25, i.e., nominally Fo/M. Such a modulated fractional-N synthesizer was developed by Cincinnati Electronics Corporation.

These synthesizer circuits also employed the technique known as two-point modulation, in which modulation components too high to be passed to the VCO 14 through loop filter 13 also were applied directly to the VCO as analog frequency modulation, bypassing the loop filter. The advantage of two-point modulation is that the VCO frequency is changed by the direct analog modulation simultaneously with changing the mean division ratio digitally using digital modulation. Thus, no phase error due to the modulation occurs in the ideal case. Consequently, the closed loop frequency response characteristics only have a second order effect on the modulation frequency response.

Unfortunately, the two-point modulated synthesizer described above may be relatively complex, as it generally requires both an analog modulation waveform for direct VCO modulation and an equivalent sampled and digitized version of the modulation waveform. The digital waveform then is effectively converted to a first order sigma-delta representation of the waveform by means of the accumulator 22. The contents of the accumulator 22 are then DtoA converted once more in DtoA convertor 21 to produce a ripple compensation waveform.

SUMMARY OF THE INVENTION

Frequency synthesizers according to the present invention generate an output frequency using a controlled oscillator, a programmable frequency divider, a phase comparator, a sigma-delta modulator and a loop filter. The sigma-delta modulator can be responsive to an analog modulation input, to thereby obviate the need for a DtoA converter and an AtoD converter, with a consequent reduction of complexity. A highly accurate DC modulated frequency synthesizer may thereby be provided.

In particular, frequency synthesizers according to the present invention include a voltage or current controlled oscillator which is responsive to a frequency control input signal, to generate an output frequency. A programmable frequency divider is responsive to the output frequency and to a divider control input, to divide the output frequency by a first integral ratio or by a second integral ratio in response to the divider control output, to thereby produce a divided signal. A phase comparator is responsive to a reference frequency signal and to the divided signal, to compare the reference frequency signal and a divided signal and thereby produce a first error signal. A sigma-delta modulator is responsive to a modulation input to produce the divider control input. A loop filter is responsive to the first error signal, to thereby produce the frequency controlled input signal.

According to other aspects of the invention, the sigma-delta modulator also produces a ripple compensation signal, and the loop filter is also responsive to the ripple compensation signal. Moreover, the controlled oscillator may also be responsive to the modulation output. A direct modulation injector may also be included which is responsive to the loop filter and to the modulation input, to produce the frequency control signal. A scaler may also be included, which is responsive to the ripple compensation signal. A compensation injector is responsive to the scaler and to the first error signal, to produce a compensated first error signal and to provide the compensated first error signal to the loop filter.

The sigma-delta modulator itself may include a comparator which compares the divider control input and the modulation input, to produce a second error signal. An error integrator may be included to integrate the second error signal and produce an integrated error signal. A sampler/quantizer may also be included which samples and quantizes the second error control signal to produce the divider control input. When using this sigma-delta modulator, the loop filter may be responsive to the first error signal and to the integrated error signal. The sigma-delta modulator may be responsive to a continuously variable analog modulation input, or to a digital modulation input.

The present invention also includes frequency synthesizers which use three-point modulators. In particular, a controlled oscillator generates an output frequency and a programmable frequency divider divides the output frequency by a first or second integral ratio, to thereby produce a divided signal. A phase comparator is responsive to a reference signal and to the divided signal, to compare the reference frequency signal and the divided signal. A three-point modulator is provided which is responsive to a modulation signal and which: (1) generates a sampled and quantized approximation of the modulation signal, and provides the sampled and quantized approximation to the frequency divider to control the first or second integral ratio; (2) generates a phase error compensation waveform from the modulation signal and combines the phase error compensation waveform and the output of the phase comparator to produce a control signal; and (3) combines the modulation signal and the first control signal to produce a second control signal which is applied to the controlled oscillator to generate the output frequency. The three-point modulator may include a sigma-delta modulator in analog or digital form.

Digital embodiments of modulators according to the present invention can modulate a frequency synthesizer with a digital data stream to produce a modulated output signal at a carrier frequency. The modulator includes a controlled oscillator, a loop filter, a phase comparator, and a programmable frequency divider. The modulator also includes an input register which stores a predetermined portion of the digital data stream, a counter and a memory including a first address input which is connected to the input register and a second input which is connected to the counter. The memory stores predetermined bit sequences. The memory provides at least one bit as a function of the first address input and the second address input to produce a control signal for the programmable frequency divider. The control signal preferably comprises a main sigma-delta data stream. The memory may also provide a ripple compensation sigma-delta data stream as a function of the first address input and the second address input, which is applied to the loop filter. The memory may also provide a direct modulation sigma-delta data stream as a function of the first address input and the second address input, which is applied to the controlled oscillator. The memory may also include a third address input which is connected to channel frequency control bits. Then, the data stream is a function of the first, second and third address inputs.

Another embodiment of digital modulators according to the present invention include a digital waveform generator such as a digital signal processor, which is responsive to the digital data stream, to generate numerical samples which represent the modulated output signal. A digital sigma-delta converter is responsive to the digital waveform generator to produce a control signal for the programmable frequency divider. The digital sigma-delta converter includes a digital comparator which is responsive to the digital waveform generator and a digital accumulator which is responsive to the digital comparator. The digital sigma-delta converter can also produce a ripple compensation signal which is applied to the loop filter and can also produce a direct compensation signal which is applied to the controlled oscillator. The digital sigma-delta converter can also be responsive to channel frequency control bits.

Frequency synthesizers according to the invention thus comprise a voltage- or current-controlled oscillator (VCO) for generating a radio frequency signal and a variable divider circuit for dividing the radio signal frequency from the VCO down to a phase comparison frequency. The divided signal is compared in a phase comparator with a reference frequency to produce a phase error signal which is filtered by a loop filter to produce a control voltage or current for the voltage- or current-controlled oscillator. The invention further comprises a modulation input to a sigma-delta modulation circuit which quantizes the modulation input signal to a stream of binary symbols at a rate synchronized to the divided signal. The binary symbols vary the division ratio of the variable divider between two adjacent division ratios such as N and N+1 so as to cause the synthesizer to generate an instantaneous signal frequency between N times the reference frequency and N+1 times the reference frequency.

The sigma-delta modulators further contain an error integrator which integrates the difference between the input modulation signal and the quantized modulation signal to produce an integrated error signal. The integrated error signal is combined with the phase error signal to suppress the quantization noise. The invention thus can provide a frequency synthesizer that allows the output signal frequency to be continuously modulated by an analog modulation signal between the discrete step frequencies of N and N+1 times the reference frequency that would be produced by a conventional synthesizer. The analog modulation signal can also be directly applied to control the voltage-or-current-controlled oscillator, bypassing the loop filter, in order to provide an upper limit to the modulation frequency response that is not limited by the loop filter.

The modulation signal may not be provided in analog form but rather as a sequence of waveform-representative digital samples. The digital samples are converted to an equivalent sigma-delta symbol stream using digital logic, and the sigma-delta stream is used to control the variable divider ratio as above. In addition, a digital accumulator within the sigma-delta conversion logic produces a digital version of the integrated error signal which is digital-to-analog converted and then combined with the phase error signal to suppress quantization noise. The digital samples may additionally be digital-to-analog converted to produce a direct modulation signal, bypassing the loop filter in order to increase the modulation high-frequency response if necessary. Related frequency synthesizing and modulating methods may also be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
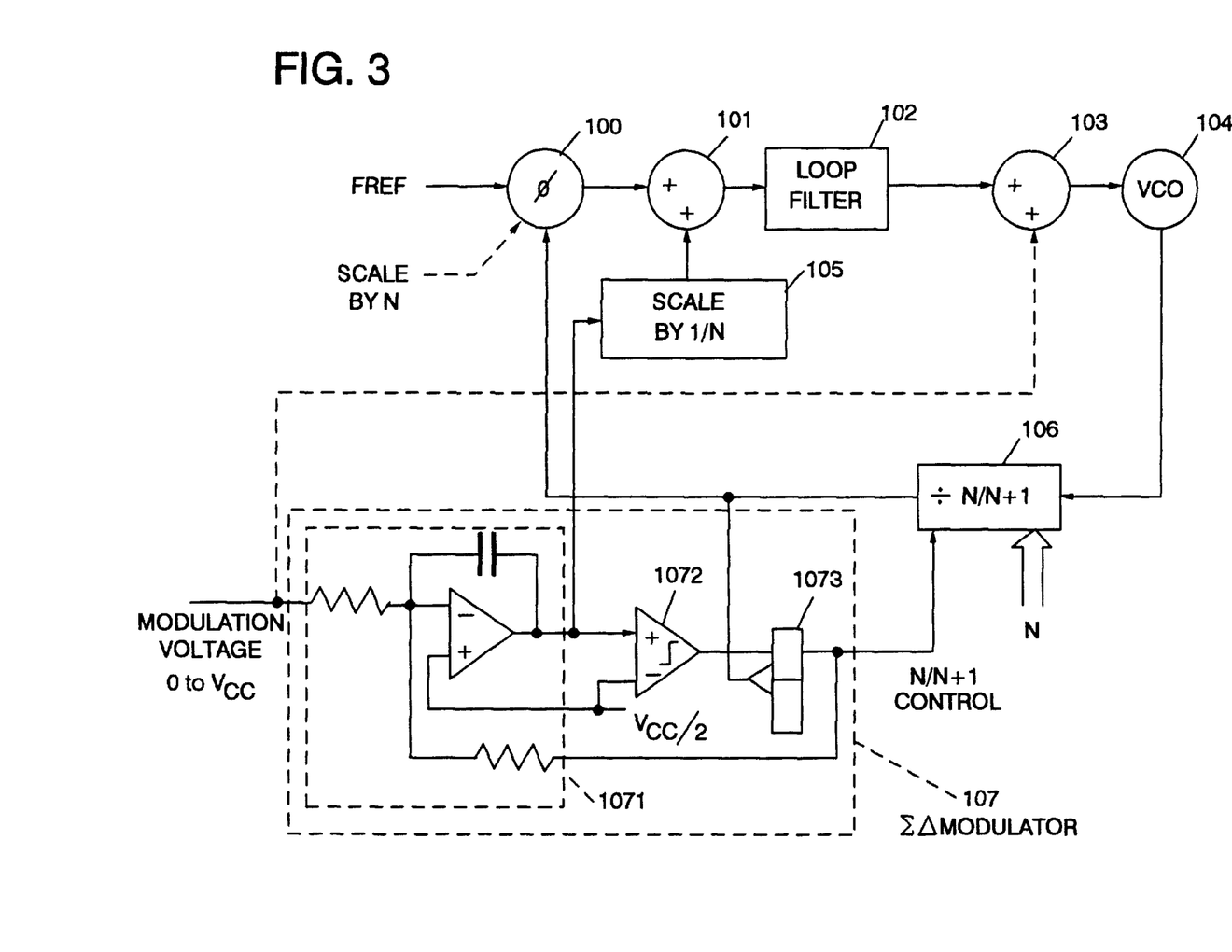
FIG. 3 is a block diagram of DC modulatable synthesizers according to the present invention.

FIG. 3 is a block diagram of DC modulatable synthesizers according to the present invention. An analog modulation waveform such as a modulation voltage between 0 and Vcc is applied to sigma-delta modulator (ΣΔ) 107 and optionally simultaneously as direct analog frequency modulation to a controlled oscillator such as VCO 104, being added to the output of loop filter 102 in adding junction 103 which functions as a direct modulation injector.

Sigma-delta modulator 107 generates a pattern of N/N+1 control signals to variable divider 106, the pattern having a mark/space ratio representative of the instantaneous modulation signal at its input. This is obtained using integrator 1071 to form the average of the difference between the output control stream from flip-flop 1073 and the input waveform. If on average the output mark/space ratio is too high, the integrator, which has an inherent inversion, will produce a falling output voltage until the integrated error voltage falls below the slicing threshold of analog comparator 1072, producing a binary ZERO at its output. The ZERO level is transferred at the next clock pulse from variable divider 106 to the output of flip-flop 1073 thus causing variable divider 106 to divide by N instead of N+1, reducing the mark/space ratio of the N/N+1 pattern. Since the modulation signal lies between the ZERO (N) level and the ONE (N+1), level the error reverses in sign and the output of integrator 1071 begins to rise until the slicing threshold of comparator 1072 is crossed once more producing a ONE (N+1) output level. The cycle then repeats.

The integrated error waveform from analog integrator 1071 is a sawtooth-like waveform which is analogous to the sawtooth cumulative phase error waveform from phase detector 100. The two waveforms are compared in FIGS. 4a–4c.

Figure 4A:
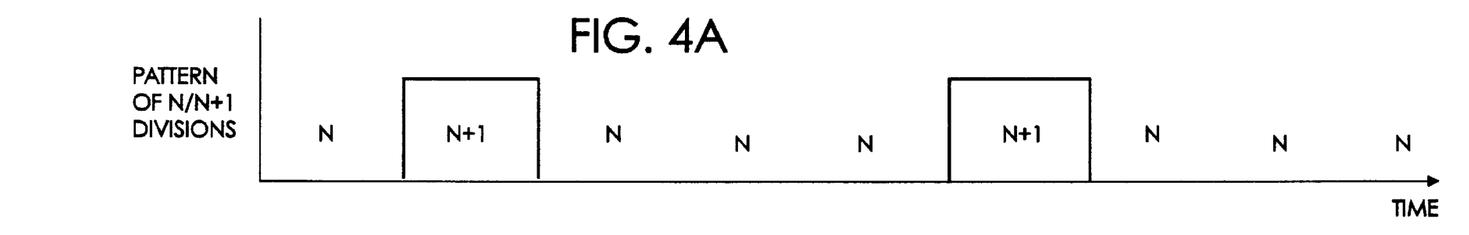
FIGS. 4a–4c are waveform diagrams for the synthesizers of FIG. 3.
Figure 4B:
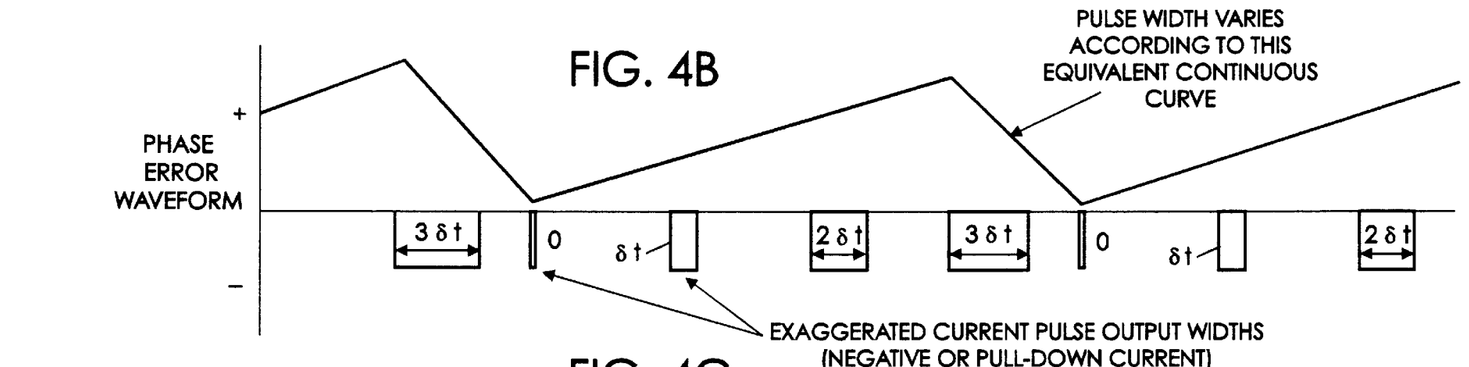
Figure 4C:
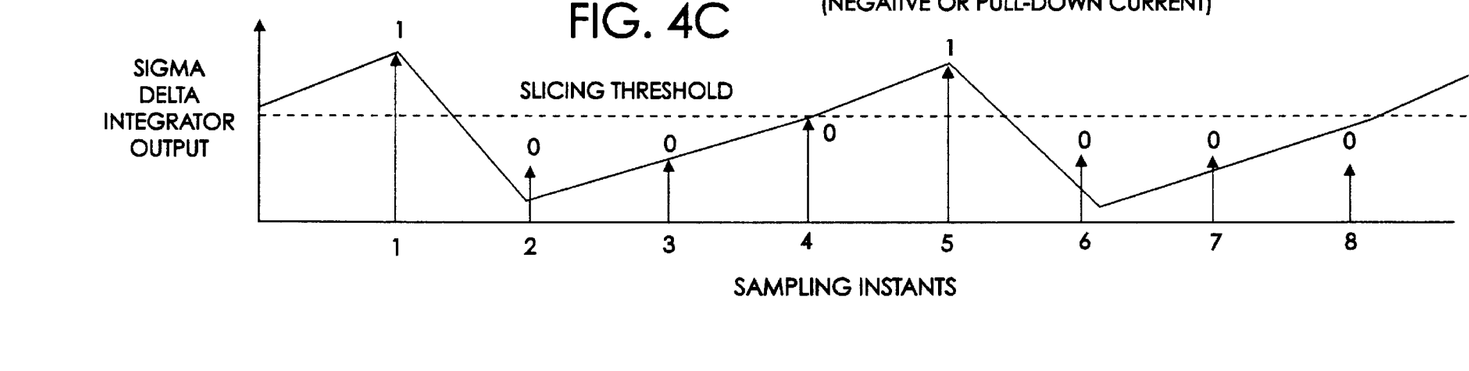

FIG. 4c shows the output of sigma-delta error integrator 1071 when the input modulation signal is held at a value ¼ the way between the lowest level and the highest level. When flip-flop 1073 is producing a zero level at its output, this is below the modulation level of ¼. The error thus is negative (−0.25) and the integrator output voltage is rising. At sampling instant (1), the integrated error is above the slicing threshold of comparator 1072 and thus a ONE is clocked into flip-flop 1073, causing the next division cycle to use a division ratio of N+1 as shown in FIG. 4a. The flip-flop output of a ONE level is now higher than the modulation input of ¼, so the error is positive (+0.75) and the integrator output is falling at three times the rate at which it was previously rising. At sampling instant 2 the integrated error has thus fallen below the slicing threshold and a ZERO is clocked into flip-flop 1073, restarting the sequence.

It takes three cycles of integrating an error of −0.25 for the integrated error to rise by the same amount as it falls in one cycle of integrating an error of +0.75, thus establishing the desired ¼ mark/space ratio for controlling divide by N/N+1. cycles of divider 106. While the divider 106 is dividing by N, its output pulse falls progressively earlier than the reference frequency pulse applied to phase detector 100. Stated differently, the reference pulse becomes progressively later. The phase detector 100 is assumed to be a so-called charge pump which turns a negative output current ON when the variable divider output pulse occurs and OFF when the reference frequency pulse occurs, or alternatively turns a positive output current pulse ON if the reference pulse occurs first and OFF when the variable divider output pulse arrives later.

In the example of FIGS. 4a–4c, a negative current pulse is produced that lasts from the instant the output pulse occurs from divider 106 to the instant the reference pulse occurs, which, being progressively later during divide-by-N periods, produces an increasing pulse width. The divide-by-(N+1) cycle then cause a step delay of one VCO cycle to the output of variable divider 106 so that it is once more aligned with the reference pulse, and the error pulse width falls to zero before repeating the sequence. The pulse width rises according to the equivalent continuous curve of FIG. 4b. This is of the same form as the integrated error from integrator 1071. The integrated error waveform is thus a suitable phase error cancellation waveform and is thus added in adder (compensation injector) 101 to the output of phase detector 100 after suitable scaling by 1/N in scaler 105 if this scaling method is used. Alternatively, as described in the Background of the Invention section, the technique of the incorporated '993 patent may be used, whereby the magnitude of the current pulse from phase detector 100 is scaled up proportionally to N instead.

By comparison of the waveforms of FIGS. 4b and 4c, it is seen that a phase error appearing as a pulse of width increasing in a sawtooth fashion is canceled by a continuous sawtooth waveform from integrator 1071 of equal and opposite mean value. This cancels all of the error components up to a frequency equal to the reference frequency. Higher frequency error components may remain. These are generally of less consequence as loop filter 102 in any case normally removes reference frequency ripple.

Improved cancellation of higher frequency error components can be achieved by sampling the output of integrator 1071 to generate a compensation waveform that occurs as a pulse around the time of occurrence of the phase detector output current pulse. In this way, the phase detector error output pulse of more or less constant magnitude and variable width is canceled by a pulse of constant width and variable magnitude from integrator 1071. The improvement in cancellation of higher frequency ripple components is explained in more detail in the incorporated '670 patent of Kingsbury, which was described in the Background of the Invention section. It will be appreciated that, when the phase detector generates an error current pulse then the compensation waveform generally should also be a current pulse. Compensation injector 101 thus provides a conversion from a voltage output from integrator 1071 to a proportional current, as necessary.

Figure 5:
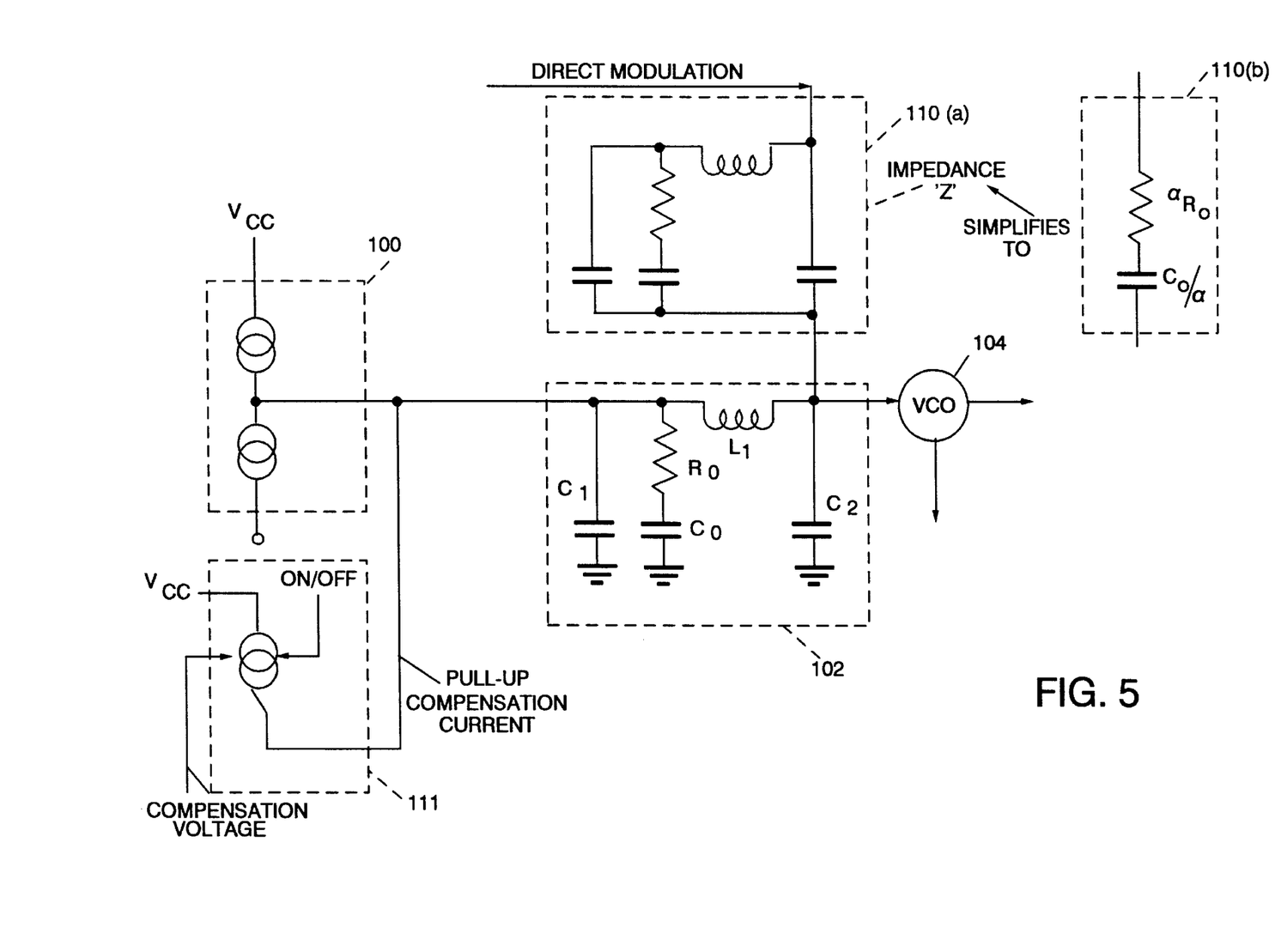
FIG. 5 is a diagram of compensation and modulation injection circuits which may be used in connection with FIG. 3.

FIG. 5 provides more detail on injecting compensation and direct modulation waveforms before and after the loop filter respectively.

Since the phase error current pulses as shown in FIG. 4b are negative-going (pull-down), the compensation current is positive-going (i.e. pull-up to Vcc). Therefore, the voltage/current convertor 111 should be a unipolar current source which produces a current proportional to a control voltage from integrator 1071. Such a current source can also be provided with an ENABLE control input that can be used to synchronize the generation of the compensation current with the occurrence of the phase detector output pulse. The two currents are joined before applying their sum to the loop filter 102. The loop filter 102 provides an integrating function by means of principal integrator capacitor Co that integrates the ripple-compensated error current to produce a control voltage for the VCO 104.

Integrating the error creates a second-order phase-lock-loop which should be stabilized by means of damping resistor Ro. More details on control of damping are given in U.S. Pat. No. 5,095,288 to the present inventor, which is hereby incorporated by reference herein. With the addition of damping resistor Ro in series with the principal integrator capacitor Co, the phase detector output current pulse is preferably absorbed in a relatively smaller capacitor C1 to avoid voltage limiting at the output of the phase detector 100. This can occur when the magnitude of the phase detector output current pulse times the damping resistor Ro is comparable to the available supply voltage Vcc. Additionally, the capacitor C1 gives more filtering of the error signal which may be insufficient at high frequencies, necessitating the addition of further components such as L1 and C2, which form a PI-network low-pass structure with C1.

If direct analog modulation of the VCO is also used to give two-point modulation, an appropriate fraction of the modulation voltage is applied to the VCO in addition to the control voltage. There are several techniques to do this, including using a second control input for modulation, using for example a second varactor diode. The modulation input should preferably have a constant sensitivity measured in Megahertz per volt. If the normal control input is used, and it does not have a constant sensitivity but rather a sensitivity that depends on the frequency (which is controlled by the variable division ratio 'N'), then the modulation signal level is preferably scaled in dependence on 'N' to provide a constant modulation level. The dependence on 'N' can be stored as a set of numerical scaling values in a Read Only Memory look-up table, for example, which method, i.e. the ROM method, has been used by applicant in a prior art synthesizer incorporated in a Marconi radio product known as SCIMITAR-V, and in a derived L. M. Ericsson radio product known as STARCOMM. The required scaling factor can also be computed by a microprocessor using the technique disclosed in co-filed U.S. application Ser. No. 08/904,131 entitled *"Systems and Methods for Automatic Deviation Setting and Control in Radio Transmitters"* to the present inventor which is also hereby incorporated by reference herein.

When a suitably scaled modulation waveform is to be combined with the VCO control voltage, as shown in FIG. 5, it is preferably applied to the VCO control line through an impedance Z 110a which has the same impedance versus frequency characteristics as the impedance that loop filter 102 provides on the control line, so as to obtain a flat modulation frequency response. This may be achieved by making impedance Z 110a using a network having the same structure as loop filter 102. Such a complicated network is often not necessary however, as the main contributors to the control line impedance at frequencies of interest are capacitor Co and damping resistor Ro. Therefore, direct modulation injection can take place through a simplified impedance 110b comprising scaled resistor α·Ro and scaled capacitor Co/α. This scaling maintains the same time constant as Ro·Co and thus maintains a substantially flat modulation frequency response. The use of a modulation injection impedance comprising a series capacitor Co/α has the added advantage of isolating the VCO control line from the DC level which may be present on the modulation input.

True DC modulation is nevertheless provided by virtue of the digital modulation applied through sigma-delta modulator 107. Indeed, this feature of true DC modulation can be used to obtain continuous frequency tuning between the values N·Fo/M and (N+1)·Fo/M by varying a modulation input voltage over the range 0 to Vcc. Continuous tuning is of use where frequencies to be transmitted or received do not lie on a regular raster, but are arbitrary, as in HF SSB communication or in communications that suffer from frequency error or Doppler shift, such as with satellites in non-geostationary orbit.

While the invention can provide a simplified modulation of a synthesizer with an analog modulation signal, it can often be simpler to generate an analog modulation signal digitally. U.S. Pat. No. 5,095,288 to the present inventor describes an improved quadrature modulator that uses sigma-delta modulation representations of analog I,Q modulating signals. When the sigma-delta waveforms represent a modulation by a digital data stream, and the digital data stream is premodulation filtered by a filter having a finite impulse response of a few data symbols duration, the number of possible sigma-delta streams that are needed to represent all possible waveform shapes that can occur over a symbol period is limited, and all may be precomputed and stored in a memory such as a ROM. The '288 patent is hereby incorporated by reference herein.

Figure 6:
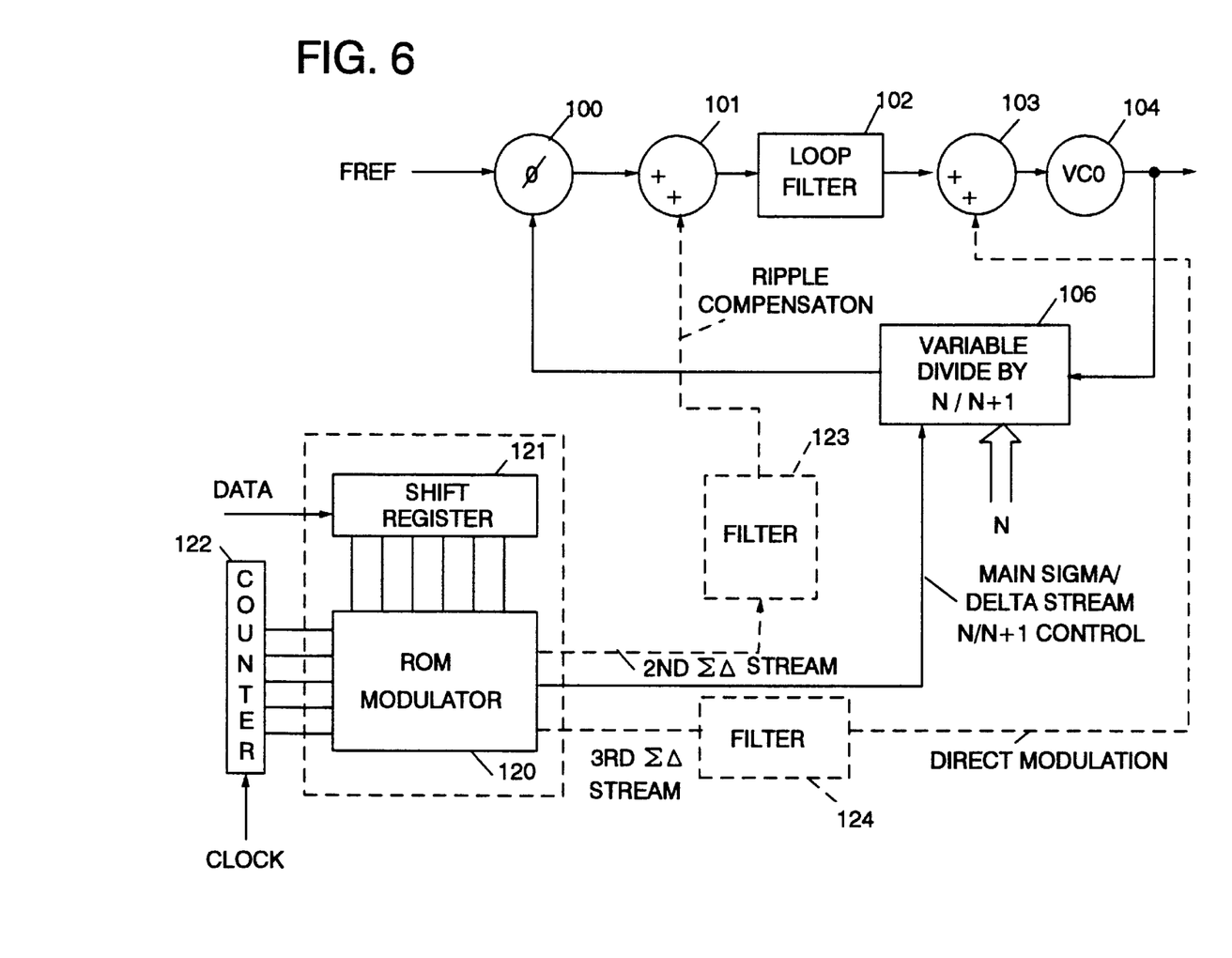
FIG. 6 is a block diagram of digital data modulators using lookup tables according to the present invention.

FIG. 6 shows a combination of a fractional-N synthesizer and a ROM modulator. Data to be modulated onto the synthesizer output signal in the form of frequency or phase modulation, which are mathematically related, is clocked through shift register 121 which stores the last 'L' data symbols on which the modulation waveform over the current symbol period depends. The 'L' symbols from shift register 121 are then used as an address to ROM 120 to select a precomputed waveform. A high frequency clock that is a multiple of the data rate is applied to counter 122 that forms other address bits to ROM 120 in order to sequentially select different points on the modulation waveform to be output from ROM 120. The outputs from ROM 120 can indeed be a sequence of 1-bit or sigma-delta samples that are then used to control variable divider 106 to divide by N or N+1 according to the precomputed pattern.

In the case of precomputed sigma-delta modulation, the analog waveform from an error integrator such as 1071 may no longer be available to be used as ripple compensation. If necessary, therefore, it can be reconstructed. A second sigma-delta stream can be precomputed and stored to represent the ripple compensation waveform which, after suitable filtering in filter 123 to remove high frequency sigma-delta components, is added to the phase detector output. It is known that the error signal of a first sigma-delta quantizer can itself be digitized using a second sigma-delta quantizer, and that the two sigma-delta streams can be combined to produce a signal representation having lower quantizing noise. This technique is called "cascade-coupled sigma-delta modulators". The form of the technique depicted in FIG. 6 however, uses a ROM modulator to obtain the main sigma-delta stream and the second sigma-delta stream.

If in addition a direct analog modulation signal is needed, this is also reconstructed. It can be reconstructed from the main sigma-delta output by means of a suitable low-pass filter. Alternatively it can be represented by yet a third precomputed sigma-delta stream. The advantage of using a third precomputed delta-sigma stream is that it can be precompensated for delay and distortion due to the frequency response of filter 124. In the simplest case, the 3rd sigma-delta stream can be a time-advanced version of the main sigma-delta stream. Such precompensation simplifies filter 124 as it need no longer be constrained to have negligible delay and distortion.

Figure 7:
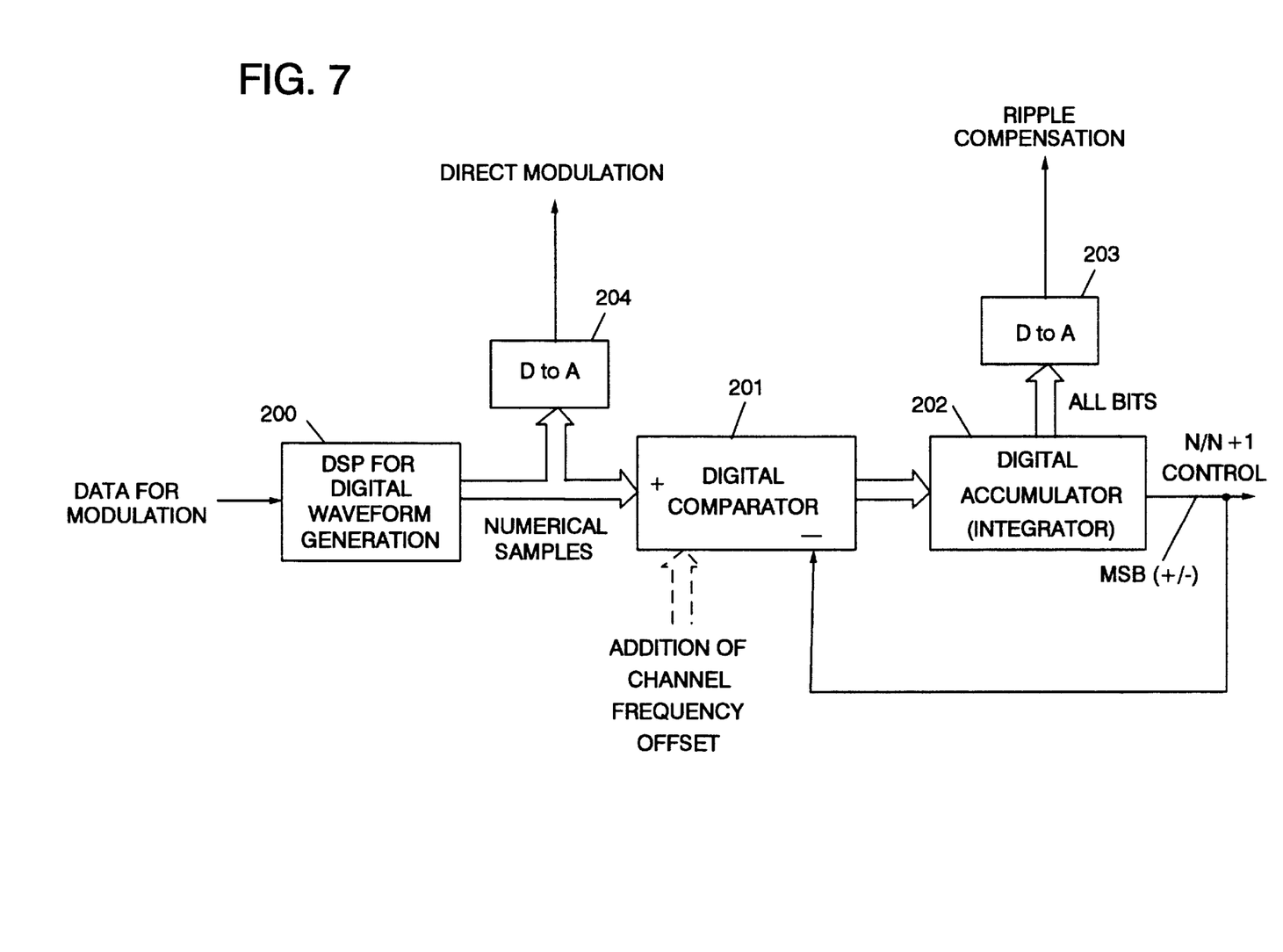
FIG. 7 is a block diagram of the digital data modulators using real-time sigma-delta converter according to the present invention.

FIG. 7 shows an alternative scheme that generates a sigma-delta stream in real time from a digital data modulation waveform. Data for modulation (i.e. comprising digital symbols such as binary ONEs and ZEROs) are applied to Digital Signal Processor 200 which generates a sequence of numerical values representative of a frequency modulation waveform. These numerical values may be converted to an analog waveform using DtoA convertor 204 if necessary to obtain a direct analog modulation waveform. The numerical samples from DSP 200 are also applied to a digital sigma-delta convertor as opposed to the analog sigma-delta modulator 107 of FIG. 3. The principle is however the same: The output delta-sigma stream is fed back and subtracted from the input waveform, this time in digital comparator 201 in order to generate an error signal. The now digital error values are digitally integrated by accumulating them in accumulator 202. The most significant bit (sign bit) of accumulator 202 tells whether the accumulated error is above or below a nominal slicing threshold of zero, and thus represents the same signal as at the output of slicer 1072 of FIG. 3. Because the output is already time-sampled however, flip-flop 1073 may not be needed and the sign bit from accumulator 202 is already the required sigma-delta bit stream. This is fed back to input comparator 201 and used to control division by N or N+1 of a variable divider. The total digital value of accumulator 202 is equivalent to the analog integrator output of integrator 1071. This value may be digital-to-analog converted using DtoA convertor 203 to give the desired ripple compensation waveform for addition to the output of a phase detector.

In the above description of FIGS. 6 and 7, it was assumed that the only desired fractional-N modulation required was for modulation. In other words the fractional-N facility was not described as being used also for generating fractional channel frequencies. This need not be the case, however. In FIG. 6, ROM 120 can have further address inputs corresponding to different fractional channel frequencies between N·Fo/M and (N+1)·Fo/M, and can store sigma-delta streams that represent a combination of modulation and fractional frequency channel offset.

Unfortunately, the fractional channel offsets may not be simply related to the data rate. For example, in the European digital cellular system known as GSM, the frequency channels are spaced by 200 KHz, or 13 MHz/65, while the data rate is 13 MHz/48. The size of the ROM due to the relative primeness of 48 and 65 may become excessive. This may be solved by the use of a real-time sigma-delta converter as in FIG. 7. Then, it may suffice to add a fractional channel offset value to the data modulation, for example to the input of comparator 201, using as many least significant bits as necessary to obtain channel frequencies having the desired precision. This arrangement of FIG. 7 permits the use of a fractional-N synthesizer having a reference frequency Fref= Fo/M that is much greater than the desired channel spacing, which can result in eliminating the need for ripple compensation DtoA 203 and direct modulation DtoA 204, thus simplifying the simultaneous generation of modulation and channel frequency offset.

In the drawings and specification, there have been disclosed typical preferred embodiments of the invention and, although specific terms are employed, they are used in a generic and descriptive sense only and not for purposes of limitation, the scope of the invention being set forth in the following claims,

I claim:

1. A frequency synthesizer which generates an output frequency, comprising:

a controlled oscillator which is responsive to a frequency control input signal, to generate the output frequency;

a programmable frequency divider which is responsive to the output frequency and to a divider control input, to divide the output frequency by a first integral ratio or by a second integral ratio in response to the divider control input, to thereby produce a divided signal;

a phase comparator which is responsive to a reference frequency signal and to the divided signal, to compare the reference frequency signal and the divided signal and thereby produce a first error signal;

a sigma-delta modulator which is responsive to an analog modulation input, to produce the divider control input and a ripple compensation signal; and a loop filter which is responsive to the first error signal and to the ripple compensation signal to thereby produce the frequency control input signal.

2. A frequency synthesizer according to claim 1 wherein the sigma-delta modulator includes an integrator, and wherein the ripple compensation signal is produced by the integrator.

3. A frequency synthesizer according to claim 1 wherein the controlled oscillator is also responsive to the analog modulation output.

4. A frequency synthesizer according to claim 1 herein the sigma-delta modulator comprises:

a comparator which compares the divider control input and the analog modulation input to produce a second error signal;

an error integrator which integrates the second error signal to produce an integrated error signal; and a sampler/quantizer which samples and quantizes the second error signal to produce the divider control input.

5. A frequency synthesizer according to claim 4 further wherein the loop filter is responsive to the first error signal and to the integrated error signal.

6. A frequency synthesizer which generates an output frequency, comprising:

a controlled oscillator which is responsive to a frequency control input signal, to generate the output frequency;

a programmable frequency divider which is responsive to the output frequency and to a divider control input, to divide the output frequency by a first integral ratio or by a second integral ratio in response to the divider control input, to thereby produce a divided signal;

a phase comparator which is responsive to a reference frequency signal and to the divided signal, to compare the reference frequency signal and the divided signal and thereby produce a first error signal;

a sigma-delta modulator which is responsive to a modulation input, to produce the divider control input;

a loop filter which is responsive to the first error signal to thereby produce the frequency control input signal; and a direct modulation injector which is responsive to the loop filter and to the modulation input, to produce the frequency control signal.

7. A frequency synthesizer according to claim 6 wherein the sigma-delta modulator is a digital sigma-delta modulator which is responsive to a digital modulation input to produce the divider control input.

8. A frequency synthesizer according to claim 6 wherein the modulation input is a continuously variable analog modulation input.

9. A frequency synthesizer which generates an output frequency, comprising:

a controlled oscillator which is responsive to a frequency control input signal, to generate the output frequency;

a programmable frequency divider which is responsive to the output frequency and to a divider control input, to divide the output frequency by a first integral ratio or by a second integral ratio in response to the divider control input, to thereby produce a divided signal;

a phase comparator which is responsive to a reference frequency signal and to the divided signal, to compare the reference frequency signal and the divided signal and thereby produce a first error signal;

a sigma-delta modulator which is responsive to a modulation input, to produce the divider control input;

a loop filter which is responsive to the first error signal to thereby produce the frequency control input signal;

a scaler which is responsive to the ripple compensation signal; and a compensation injector which is responsive to the scaler and to the first error signal, to produce a compensated first error signal, and to provide the compensated first error signal to the loop filter.

10. A frequency synthesizer which generates an output frequency, comprising:

a controlled oscillator which generates the output frequency;

a programmable frequency divider which divides the output frequency by a first or second integral ratio to thereby produce a divided signal;

a phase comparator which is responsive to a reference signal and to the divided signal, to compare the reference frequency signal and the divided signal; and a three point modulator which is responsive to a modulation signal, and generates a sampled and quantized approximation of the modulation signal and provides the sampled and quantized approximation to the frequency divider to control the first or second integral ratio, which generates a phase error compensation waveform from the modulation signal and combines the phase error compensation waveform and the output of the phase comparator to produce a first control signal, and which combines the modulation signal and the first control signal to produce a second control signal which is applied to the controlled oscillator to generate the output frequency.

11. A frequency synthesizer according to claim 10 wherein the three point modulator comprises a sigma-delta modulator.

12. A frequency synthesizer according to claim 11 wherein the sigma-delta modulator is a digital sigma-delta modulator.

13. A modulator which modulates a frequency synthesizer with a digital data stream to produce a modulated output signal at a carrier frequency, the frequency synthesizer including a controlled oscillator, a loop filter, a phase comparator and a programmable frequency divider, the modulator comprising:

an input register which stores a predetermined portion of the digital data stream;

a counter which increments at a multiple of the symbol rate of the digital data stream; and a memory including a first address input which is connected to the input register and a second address input which is connected to the counter, the memory storing predetermined bit sequences;

the memory providing at least one bit as a function of the first address input and the second address input, to produce a control signal for the programmable frequency divider;

wherein the programmable frequency divider is connected to the counter to clock the counter.

14. A modulator according to claim 13 wherein the memory includes a third address input which is connected to channel frequency control bits, the at least one bit being a function of the first, second and third address inputs.

15. A modulator according to claim 13 wherein the control signal comprises a main sigma-delta data stream.

16. A modulator according to claim 15 wherein the memory also provides a ripple compensation sigma-delta data stream as a function of the first address input and the second address input, and which is applied to the loop filter.

17. A modulator according to claim 16 wherein the memory also provides a direct modulation sigma-delta data stream as a function of the first address input and the second address input, and which is applied to the controlled oscillator.

18. A modulator which modulates a frequency synthesizer with a digital data stream to produce a modulated output signal at a carrier frequency, the frequency synthesizer including a controlled oscillator, a loop filter and a phase comparator, the modulator comprising:

a digital waveform generator which is responsive to the digital data stream to generate numerical samples which represent the modulation waveform;

a digital sigma-delta converter which is responsive to the digital waveform generator to convert the numerical samples into a stream of sigma-delta modulation symbols at a symbol rate which is determined by a clock signal; and a programmable frequency divider which divides the controlled oscillator output by an integer determined by the sigma-delta modulation symbols, to produce the clock signal.

19. A modulator according to claim 18 wherein the digital sigma-delta converter comprises a digital comparator which is responsive to the digital waveform generator, and a digital accumulator which is responsive to the digital comparator.

20. A modulator according to claim 18 wherein the digital sigma-delta converter also produces a ripple compensation signal which is applied to the loop filter.

21. A modulator according to claim 18 wherein the digital sigma-delta converter is also responsive to channel frequency control bits.

22. A modulator which modulates a frequency synthesizer with a digital data stream to produce a modulated output signal at a carrier frequency, the frequency synthesizer including a controlled oscillator, a loop filter, a phase comparator and a programmable frequency divider, the modulator comprising:

a digital waveform generator which is responsive to the digital data stream to generate numerical samples which represent the modulation waveform; and a digital sigma-delta converter which is responsive to the digital waveform generator to produce a control signal for the programmable frequency divider;

wherein the digital sigma-delta converter also produces a ripple compensation signal which is applied to the loop filter; and wherein the digital sigma-delta converter also produces a direct compensation signal which is applied to the controlled oscillator.

23. A frequency synthesizing method for generating a modulated output signal at a desired frequency, comprising the steps of:

generating the modulated output signal using a controlled oscillator having a frequency control signal input;

sigma-delta converting a modulation input to produce a second error signal and a stream of sigma-delta modulation symbols at a symbol rate determined by a clock signal;

dividing the modulated output signal by an integer ratio selected from at least a first integer ratio or a second integer ratio in response to the symbols and a frequency control input, to produce the clock signal;

comparing the clock signal with a reference frequency signal to thereby produce a first error signal; and loop filtering the first and second error signals to thereby produce the frequency control signal input to the controlled oscillator.

24. A frequency synthesizing method according to claim 23 wherein the sigma-delta converter includes an integrator and wherein the second error signal is produced by the integrator.

25. A frequency synthesizing method according to claim 23, wherein the at least a first and a second integer ratios are changed according to the desired frequency.

26. A frequency synthesizing method according to claim 23 wherein the sigma-delta modulating step comprises the steps of:

comparing the divider control input and the modulation input to produce the second error signal;

integrating the second error signal to produce an integrated error signal; and sampling and quantizing the second error signal to produce the divider control signal.

27. A frequency synthesizing method according to claim 23 wherein the modulation input is a continuously variable analog modulation input.

28. A modulating method for a frequency synthesizer which generates an output frequency, the frequency synthesizer comprising a controlled oscillator which generates the output frequency; a programmable frequency divider which divides the output frequency to thereby produce a divided signal; and a phase comparator which is responsive to a reference signal and to the divided signal, to compare the reference frequency signal and the divided signal; the modulating method comprising the steps of:

generating a sampled and quantized approximation of the modulation signal and providing the sampled and quantized approximation to the frequency divider;

generating a phase error compensation waveform from the modulation signal and combining the phase error compensation waveform and the output of the phase comparator to produce a first control signal; and combining the modulation signal and the first control signal to produce a second control signal which is applied to the controlled oscillator to generate the output frequency.

29. A modulating method for modulating a frequency synthesizer with a digital data stream to produce a modulated output signal at a carrier frequency, the frequency synthesizer including a controlled oscillator, a loop filter, a phase comparator and a programmable frequency divider, the modulating method comprising the steps of:

generating numerical samples from the digital data stream, which represent the modulated output signal; and digital sigma-delta converting the numerical samples to produce a control signal for the programmable frequency divider, wherein the digital sigma-delta converting step further comprises the steps of:

producing a ripple compensation signal which is applied to the loop filter; and producing a direct compensation signal which is applied to the controlled oscillator.

* * * * *